United States Patent
Schwarz et al.

(10) Patent No.: US 8,841,168 B2
(45) Date of Patent: Sep. 23, 2014

(54) SOLDERING RELIEF METHOD AND SEMICONDUCTOR DEVICE EMPLOYING SAME

(71) Applicant: QUALCOMM Incorporated, San Diego, CA (US)

(72) Inventors: Mark Wendell Schwarz, San Diego, CA (US); Jianwen Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/890,625

(22) Filed: May 9, 2013

(65) Prior Publication Data

US 2013/0244384 A1    Sep. 19, 2013

Related U.S. Application Data

(62) Division of application No. 13/228,925, filed on Sep. 9, 2011, now Pat. No. 8,461,676.

(51) Int. Cl.
| | |
|---|---|
| *H01L 21/02* | (2006.01) |
| *H01L 21/12* | (2006.01) |
| *H01L 21/48* | (2006.01) |
| *H01L 23/498* | (2006.01) |
| *H01L 23/00* | (2006.01) |
| *H01L 21/56* | (2006.01) |
| *H05K 3/34* | (2006.01) |
| *H01L 21/00* | (2006.01) |

(52) U.S. Cl.
CPC ....... *H01L 24/11* (2013.01); *H01L 2924/15311* (2013.01); *H01L 21/4853* (2013.01); *H01L 23/49811* (2013.01); *H01L 21/56* (2013.01); *H05K 3/3436* (2013.01)
USPC ........... 438/112; 438/106; 438/124; 257/701; 257/731; 257/678

(58) Field of Classification Search
USPC ................................... 438/106–128
See application file for complete search history.

(56) References Cited

U.S. PATENT DOCUMENTS

| 5,438,224 A | 8/1995 | Papageorge et al. |
| 6,016,013 A | 1/2000 | Baba |

(Continued)

FOREIGN PATENT DOCUMENTS

| JP | 10125720 A | 5/1998 |
| JP | 2000150557 A | 5/2000 |

(Continued)

OTHER PUBLICATIONS

100441 QC app filed Sep. 15, 2012.

(Continued)

*Primary Examiner* — Seahvosh Nikmanesh
*Assistant Examiner* — Evren Seven
(74) *Attorney, Agent, or Firm* — Michelle S. Gallardo

(57) ABSTRACT

A semiconductor device includes a substrate having a first side and a second side, the second side having a mounting location for at least one semiconductor element, and the first side having a plurality of locations electrically connected to locations on the second side. A plurality of electrically conductive interconnects are provided at the locations, each having a first end attached at the location and a second end spaced from the substrate, and an encapsulant partially encapsulates the plurality of interconnects and has a surface lying in a first plane. The second ends are located on the side of the first plane opposite from the substrate first side, an annular space in the encapsulant surrounds each of the plurality of electrically conductive interconnects, and the annular space has a bottom located between the first plane and the substrate first side. Also a method for making such a semiconductor device.

19 Claims, 5 Drawing Sheets

(56) References Cited

U.S. PATENT DOCUMENTS

| | | |
|---|---|---|
| 6,054,171 A | 4/2000 | Shoji |
| 6,137,164 A | 10/2000 | Yew et al. |
| 6,181,569 B1 | 1/2001 | Chakravorty |
| 6,462,421 B1 | 10/2002 | Hsu et al. |
| 6,774,473 B1 | 8/2004 | Shen |
| 6,798,057 B2 | 9/2004 | Bolkin et al. |
| 6,815,254 B2 | 11/2004 | Mistry et al. |
| 6,856,009 B2 | 2/2005 | Bolken et al. |
| 7,070,207 B2 | 7/2006 | Asai |
| 7,141,873 B2 | 11/2006 | Aoyagi |
| 7,348,215 B2 | 3/2008 | Lee |
| 7,462,510 B2 | 12/2008 | James et al. |
| 7,737,565 B2 | 6/2010 | Coffy |
| 7,749,882 B2 | 7/2010 | Kweon et al. |
| 7,777,351 B1 | 8/2010 | Berry et al. |
| 7,795,721 B2 | 9/2010 | Kurita |
| 7,867,818 B2 | 1/2011 | Suh et al. |
| 7,871,861 B2 | 1/2011 | Song et al. |
| 7,935,991 B2 | 5/2011 | Wood et al. |
| 7,956,453 B1 | 6/2011 | Kim et al. |
| 8,004,074 B2 | 8/2011 | Mori et al. |
| 8,008,121 B2 | 8/2011 | Choi et al. |
| 8,022,523 B2 | 9/2011 | Chen et al. |
| 8,076,765 B2 * | 12/2011 | Chen et al. .................. 257/686 |
| 8,106,495 B2 | 1/2012 | Kajiki |
| 8,148,806 B2 | 4/2012 | Lin et al. |
| 8,378,477 B2 * | 2/2013 | Do et al. .................. 257/686 |
| 2001/0013653 A1 | 8/2001 | Shoji |
| 2002/0030261 A1 | 3/2002 | Rolda, Jr. et al. |
| 2003/0042564 A1 | 3/2003 | Taniguchi et al. |
| 2003/0218250 A1 * | 11/2003 | Kung et al. .................. 257/737 |
| 2004/0036164 A1 | 2/2004 | Koike et al. |
| 2006/0012037 A1 | 1/2006 | Raedt et al. |
| 2006/0134833 A1 | 6/2006 | Baek et al. |
| 2006/0261446 A1 | 11/2006 | Wood et al. |
| 2006/0284299 A1 | 12/2006 | Karnezos |
| 2007/0221400 A1 | 9/2007 | Kurashina et al. |
| 2007/0235218 A1 | 10/2007 | Miyamoto et al. |
| 2008/0116574 A1 | 5/2008 | Fan |
| 2008/0185708 A1 | 8/2008 | Chen et al. |
| 2008/0258289 A1 | 10/2008 | Pendse et al. |
| 2008/0284017 A1 | 11/2008 | Lee et al. |
| 2009/0045513 A1 | 2/2009 | Kim et al. |
| 2009/0095518 A1 | 4/2009 | Matsushita et al. |
| 2009/0236718 A1 | 9/2009 | Yang et al. |
| 2010/0059873 A1 | 3/2010 | Chow et al. |
| 2010/0171205 A1 | 7/2010 | Chen et al. |
| 2011/0089563 A1 | 4/2011 | Kikuchi et al. |
| 2011/0157452 A1 | 6/2011 | Goh et al. |
| 2011/0157853 A1 | 6/2011 | Goh |
| 2011/0201194 A1 | 8/2011 | Gruber et al. |
| 2011/0272819 A1 | 11/2011 | Park et al. |
| 2011/0285026 A1 | 11/2011 | Bchir et al. |
| 2013/0062746 A1 | 3/2013 | Schwarz et al. |

FOREIGN PATENT DOCUMENTS

| | | |
|---|---|---|
| JP | 2002343931 A | 11/2002 |
| JP | 2004240233 A | 8/2004 |
| JP | 2007281301 A | 10/2007 |
| JP | 2009094195 A | 4/2009 |
| KR | 20080111328 A | 12/2008 |

OTHER PUBLICATIONS

International Preliminary Report on Patentability—PCT/US2011/037211, The International Bureau of WIPO—Geneva, Switzerland, Nov. 12, 2012.

International Search Report and Written Opinion—PCT/US2011/037211—ISA/EPO—Aug. 30, 2011.

International Search Report and Written Opinion—PCT/US2012/054491—ISA/EPO—Jan. 21, 2013.

* cited by examiner

SOLDERING RELIEF METHOD AND SEMICONDUCTOR DEVICE EMPLOYING SAME

CLAIM OF PRIORITY UNDER 35 U.S.C. §120

The present Application for Patent is a divisional of patent application Ser. No. 13/228,925 entitled "Soldering Relief Method and Semiconductor Device Employing Same" filed Sep. 9, 2011, pending, and assigned to the assignee hereof and hereby expressly incorporated by reference herein.

FIELD OF DISCLOSURE

The present application is directed to a soldering relief method and to a semiconductor device having structures formed by the method, and, more specifically, to a soldering relief method that partially encapsulates electrical interconnects on a substrate, which interconnects may be solder balls, and forms annular regions around the interconnects while leaving the interconnects partially encapsulated and to a semiconductor device formed by the method.

BACKGROUND

Wafer-level packaging is an arrangement in which individual dies are pre-packaged with a redistribution layer before cutting the wafers to singulate the dies. This enables the use of sophisticated semiconductor processing techniques to form smaller arrays of electrical interconnects such as solder balls. Additionally, wafer-level packaging is an efficient process that simultaneously packages a plurality of dies, thereby reducing costs and increasing throughput.

Conventional wafer-level packaging includes electrical interconnects (referred to hereinafter as "solder balls" although other types of interconnects may also be used) between a semiconductor device and a substrate on which it is mounted that are generally quite small and thus may be damaged. Thermal cycling and different coefficients of thermal expansion of the structures connected to the solder balls further stress these connections and can eventually lead to failure.

One method of increasing the bonding strength between the solder balls and a substrate involves forming a layer of material, which may comprise, for example, an epoxy-like molding compound, around an array of solder balls to at least partially encapsulate the solder balls while leaving a portion of each solder ball exposed for subsequent connection to another electrical contact. FIG. 10 shows such a conventional approach to solder ball encapsulation in which a substrate 1000 has a plurality of solder balls 1002 connected thereto which are partially covered with an encapsulant 1004 in a manner that leaves end portions 1006 of the solder balls 1002 projecting from the encapsulant.

While this approach strengthens the connection between the solder balls and the semiconductor device to which they are mounted under some conditions, it has been found that under other conditions it may not provide the same degree of strengthening. First, thermal expansion of the molding material may stress the connections between the solder balls and the substrate. Also, it has been found that during reflow processes in which the solder balls are heated to allow for bonding, the solder balls do not collapse the same way as they do when they are not encapsulated. The type of solder ball collapse that occurs in the presence of the encapsulant sometimes results in weakened portions of the reflowed solder balls and/or creates stress concentration points which may be more prone to failure. It would therefore be desirable to obtain the benefits of conventional solder ball encapsulation while avoiding the aforementioned issues.

SUMMARY

Exemplary embodiments of the invention are directed to semiconductor devices and methods for making same.

A first aspect comprises a method of forming a semiconductor device that includes providing a substrate having a top side having a mounting location for at least one semiconductor element and a bottom side having a plurality of locations electrically connected to locations on the top side. The method also includes forming a plurality of electrically conductive interconnects at the plurality of locations on the bottom side and at least partially encapsulating, with an encapsulant, the plurality of interconnects without completely encapsulating the interconnects. The method also includes removing a portion of the encapsulant adjacent to each of the interconnects to expose previously encapsulated portions of the interconnects while leaving portions of the interconnects adjacent to the bottom side encapsulated by the encapsulant.

Another aspect comprises a method of forming a semiconductor device that includes providing a substrate having a planar first side lying in a first plane, forming a plurality of electrically conductive interconnects on the first side, at least partially encapsulating, with an encapsulant, the plurality of interconnects without completely encapsulating the interconnects, and forming an annular region in the encapsulant around the interconnects having a flat bottom parallel to or lying in the first plane.

A further aspect comprises a semiconductor device that includes a substrate having a first side and a second side and a plurality of electrically conductive interconnects on the first side of the substrate each having a first end attached to the substrate and a second end spaced from the substrate. An encapsulant partially encapsulates the plurality of interconnects and has a surface lying in a first plane, and the second ends are located on the side of the first plane opposite from the substrate first side. An annular space is provided in the encapsulant surrounding each of the plurality of electrically conductive interconnects, and the annular space has a flat bottom parallel to the first side.

Yet another aspect comprises a semiconductor device that includes a substrate having a first side and a second side, the second side including a mounting location for at least one semiconductor element, and the first side having a plurality of locations electrically connected to locations on the second side. A plurality of electrically conductive interconnects are provided at the locations each having a first end attached at the location and a second end spaced from the substrate. An encapsulant partially encapsulates the plurality of interconnects and has a surface lying in a first plane, and the second ends are located on the side of the first plane opposite from the substrate first side. An annular space is provided in the encapsulant surrounding each of the plurality of electrically conductive interconnects, the annular space having a bottom located between the first plane and the substrate first side.

Another aspect comprises a method of forming a semiconductor device that includes providing a substrate having a top side having a mounting location for at least one semiconductor element and a bottom side having a plurality of locations electrically connected to locations on the top side. The method also includes steps for forming a plurality of electrically conductive interconnects at the plurality of locations on the bottom side, steps for at least partially encapsulating, with an encapsulant, the plurality of interconnects without completely encapsulating the interconnects, and steps for removing a portion of the encapsulant adjacent to each of the interconnects to expose previously encapsulated portions of the interconnects while leaving portions of the interconnects adjacent to the bottom side encapsulated by the encapsulant.

An additional aspect comprises a method of forming a semiconductor device that includes providing a substrate having a planar first side lying in a first plane and steps for forming a plurality of electrically conductive interconnects on the first side, steps for at least partially encapsulating, with an encapsulant, the plurality of interconnects without completely encapsulating the interconnects, and steps for forming an annular region in the encapsulant around the interconnects having a flat bottom parallel to or lying in the first plane.

A further aspect comprises a semiconductor device that includes a substrate mechanism having a first side and a second side and a plurality of electrically conductive interconnect mechanisms on the first side of the substrate each having a first end attached to the substrate mechanism and a second end spaced from the substrate mechanism. The device also includes an encapsulant arrangement partially encapsulating the plurality of interconnect mechanisms and having a surface lying in a first plane, the second ends being located on the side of the first plane opposite from the substrate mechanism first side and an annular space arrangement in the encapsulant surrounding each of the plurality of electrically conductive interconnect mechanisms, the annular space arrangement having a flat bottom parallel to the first side.

Another aspect comprises a semiconductor device that includes a substrate mechanism having a first side and a second side, the second side including a mounting arrangement for at least one semiconductor element and the first side having a plurality of locations electrically connected to locations on the second side. The device includes electrically conductive interconnect mechanisms at the locations each having a first end attached at the location and a second end spaced from the substrate mechanism and an encapsulant arrangement partially encapsulating the interconnect mechanism and having a surface lying in a first plane, the second ends being located on the side of the first plane opposite from the substrate first side. An annular space arrangement is provided in the encapsulant arrangement surrounding each of the plurality of interconnect mechanisms, the annular space arrangement having a bottom located between the first plane and the substrate first side.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
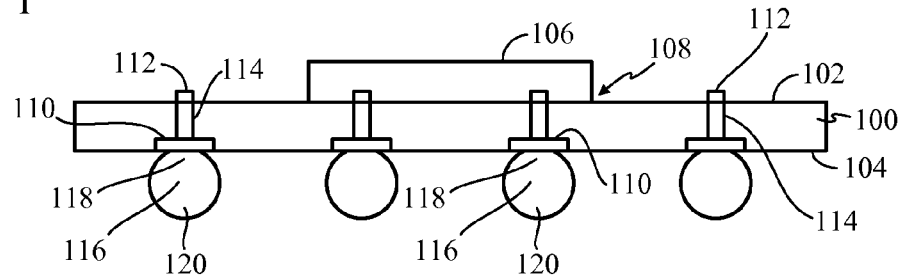
FIG. 1 is a schematic side elevational view of a first production stage of a device which stage includes a semiconductor element mounted on a substrate and a plurality of solder balls attached to the substrate.

Referring now to FIG. 1, a substrate 100 has a first or top surface 102 and a second or bottom surface 104 and may comprise, for example, a conventional printed circuit board, silicon, ceramic or flex board. A semiconductor element 106 is mounted at a mounting location 108 on the top surface 102 and electrically connected to conductive pads 110 on the bottom surface 104 by traces 112 and vias 114. Electrically conductive interconnects 116, which may comprise solder balls and which may be referred to hereinafter generally as solder balls, each have a first end 118 connected to one of the conductive pads 110 in a conventional manner and a second end 120 diametrically opposite the first end 118. A redistribution layer (not illustrated) or other layers (not illustrated) may also optionally be provided.

Figure 2:
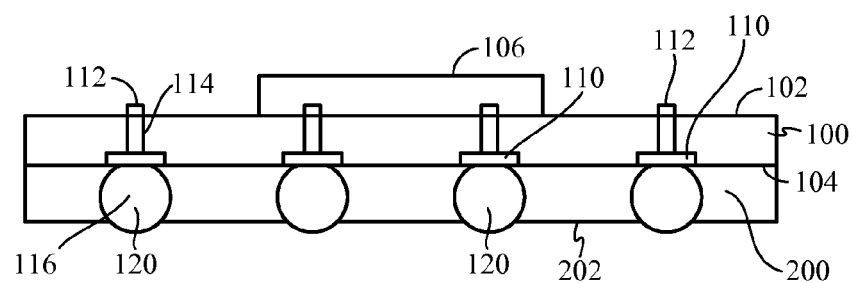
FIG. 2 is a schematic side elevational view of a second production stage of a device in which a layer of encapsulant has been applied to the substrate around the solder balls of the production stage of FIG. 1.
Figure 11:
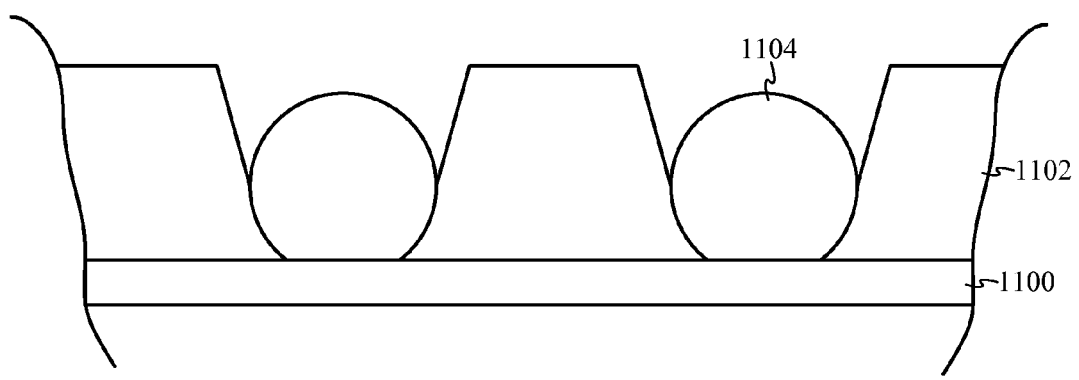
FIG. 11 is a sectional side elevational view of conventional solder balls mounted on the top surface of a substrate and partially surrounded by an encapsulant.

FIG. 2 shows the substrate 100 after a layer of encapsulant 200 has been applied to the bottom surface 104 in a manner that surrounds the solder balls 116 while leaving the second ends 120 of the solder balls 116 exposed through the outer surface 202 of the encapsulant. (This contrasts with certain conventional processes that completely encapsulate solder balls on the top surface of a substrate and then remove a portion of the encapsulant. FIG. 11 shows a substrate 1100 with solder balls 1104 connected thereto and completely covered by an encapsulant 1102, a portion of which is then removed.)

Figure 3:
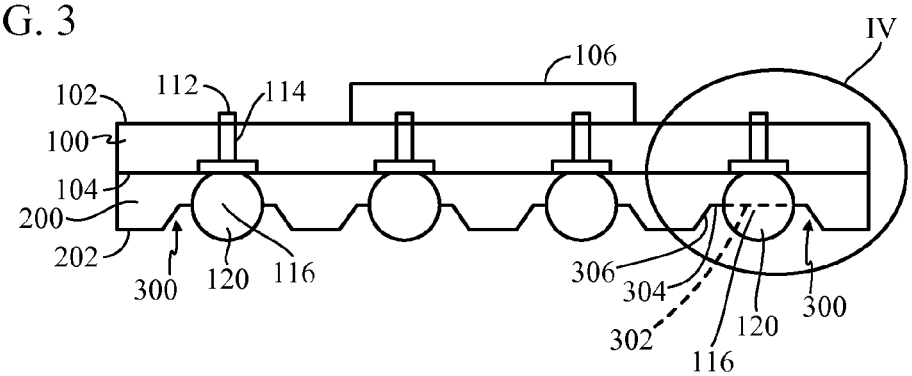
FIG. 3 is a schematic side elevational view of a third production stage of a device after a portion of the encapsulant has been removed from around the solder balls of the production stage of FIG. 2.
Figure 4:
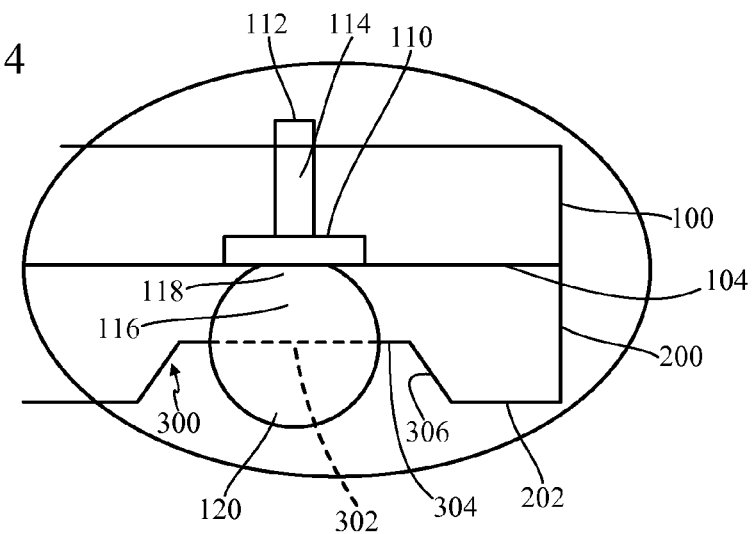
FIG. 4 is a detail view of region IV in FIG. 3.
Figure 6:
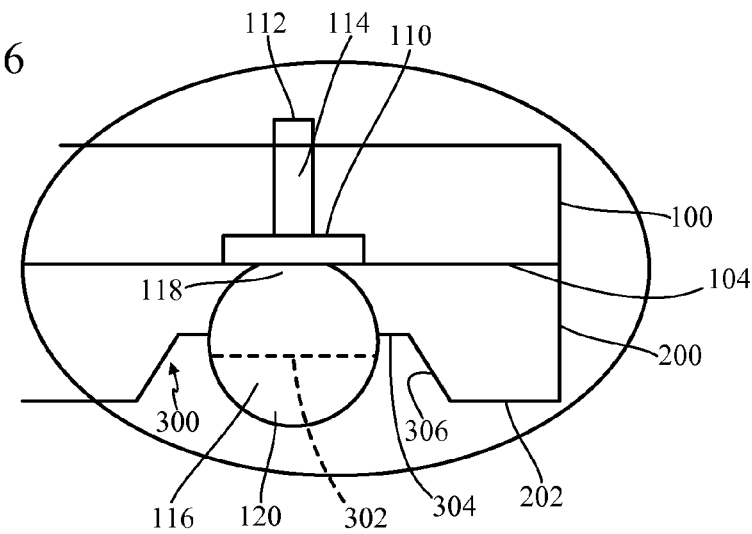
FIG. 6 is a detail view of a region corresponding to region IV of FIG. 3 according to another embodiment.
Figure 7:
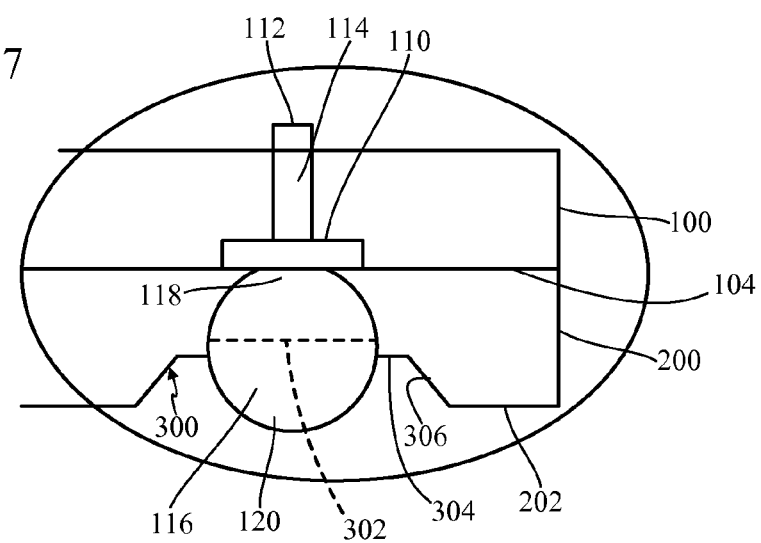
FIG. 7 is a detail view of a region corresponding to region IV of FIG. 3 according to another embodiment.

FIGS. 3 and 4 show the device of FIG. 2 after annular regions 300 have been removed from around each of the solder balls 116 which removal may be performed by various methods including laser ablation or mechanical processes. The encapsulant is removed from approximately half of the solder ball 116, down to a level where a diameter of the solder ball lies in a plane 302 parallel to the bottom surface 104. Each annular region 300 includes a flat bottom 304 and a sidewall 306 extending from the flat bottom 304 to the outer surface 202 of the encapsulant. The creation of these annular regions reduces the stress applied to the solder balls 116 and their connections to the conductive pads 110 by thermal expansion and contraction of the encapsulant. In alternate embodiments, the flat bottom 304 may be located between the plane 302 and the bottom surface 104 as illustrated in FIG. 6 or between the plane 302 and the outer surface 202 of the encapsulant 200 as illustrated in FIG. 7.

Figure 5:
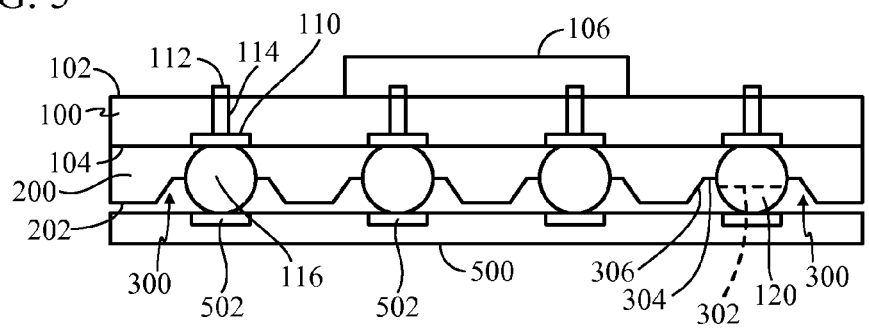
FIG. 5 is a schematic side elevational view of the structure of FIG. 3 attached to a surface.

FIG. 5 shows the device of FIG. 3 being mounted on a surface 500 having a plurality of electrical contacts 502. The solder balls 116 of the substrate 100 are placed on the electrical contacts 502 and bonded thereto using a reflow process which may include applying pressure against the top surface 102 of the substrate 100.

Figure 8:
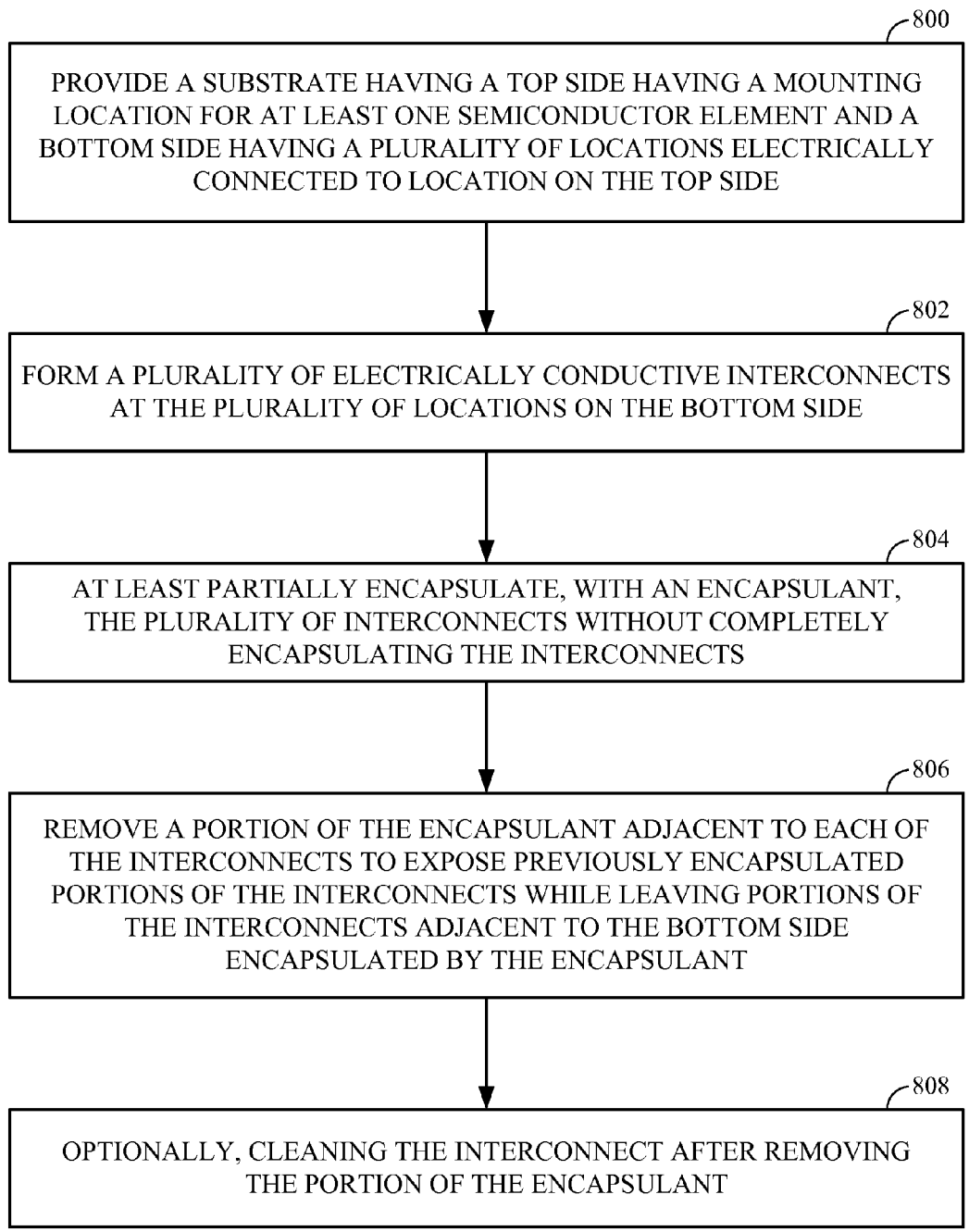
FIG. 8 is a flow chart illustrating a method according to one embodiment.

FIG. 8 illustrates a method that includes a block 800 of providing a substrate having a top side having a mounting location for at least one semiconductor element and a bottom side having a plurality of locations electrically connected to locations on the top side, a block 802 of forming a plurality of electrically conductive interconnects at the plurality of locations on the bottom side, a block 804 of at least partially encapsulating, with an encapsulant, the plurality of interconnects without completely encapsulating the interconnects, a block 806 of removing a portion of the encapsulant adjacent to each of the interconnects to expose previously encapsulated portions of the interconnects while leaving portions of the interconnects adjacent to the bottom side encapsulated by the encapsulant and a block 808 of, optionally, cleaning the interconnect after removing a portion of the encapsulant.

Figure 9:
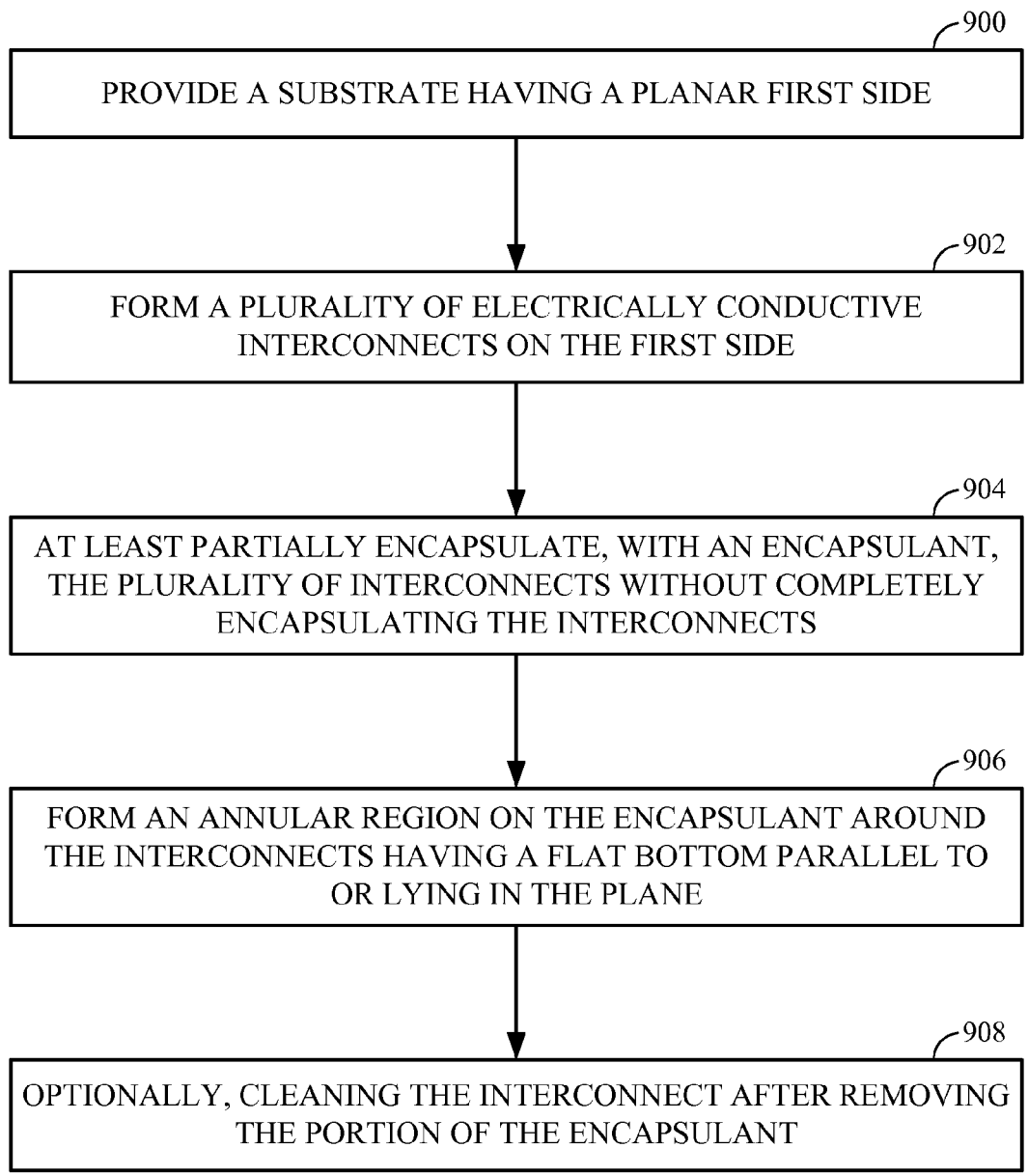
FIG. 9 is a flow chart illustrating a method according to another embodiment.
Figure 10:
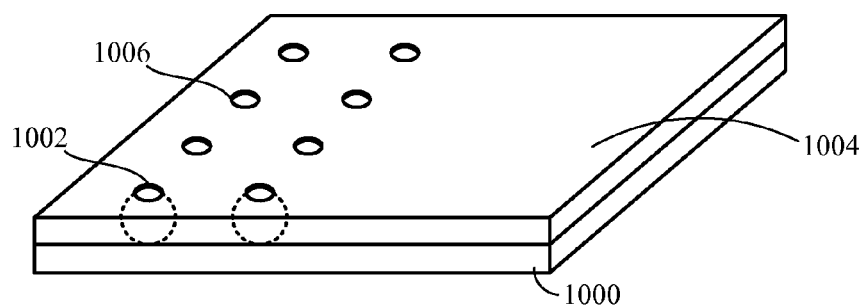
FIG. 10 is a perspective view of a conventional semiconductor substrate with a plurality of partially encapsulated solder balls.

FIG. 9 illustrates a method that includes a block 900 of providing a substrate having a planar first side, a block 902 of forming a plurality of electrically conductive interconnects on the first side, a block 904 of at least partially encapsulating, with an encapsulant, the plurality of interconnects without completely encapsulating the interconnects, a block 906 of forming an annular region in the encapsulant around the interconnects having a flat bottom parallel to or lying in the plane, and a block 908 of, optionally, cleaning the interconnect after removing a portion of the encapsulant.

The substrate 100 and encapsulated solder balls 116 may be used in a variety of environments, such as, without limitation, a set top box, a music player, a video player, an entertainment unit, a navigation device, a communications device, personal digital assistant (PDA), a fixed location data unit, or a computer.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of forming a semiconductor device comprising:
    providing a substrate having a top side having a mounting location for at least one semiconductor element and a bottom side having a plurality of locations electrically connected to locations on said top side;
    forming a plurality of electrically conductive interconnects at the plurality of locations on the bottom side;
    at least partially encapsulating, with an encapsulant, the plurality of electrically conductive interconnects without completely encapsulating the interconnects; and
    removing a portion of the encapsulant adjacent to each of the interconnects to expose previously encapsulated portions of the interconnects while leaving portions of the interconnects adjacent to the bottom side encapsulated by the encapsulant, wherein removing a portion of the encapsulant comprises forming an annular region in the encapsulant around the at least one of the solder balls, the annular region having a flat bottom parallel to or lying in a plane parallel to the bottom side.

2. The method of claim 1, wherein the removing is performed by laser ablation.

3. The method of claim 1, wherein the interconnects are solder balls and wherein a diameter of at least one of the solder balls lies in a plane parallel to the bottom side.

4. The method of claim 3, wherein removing a portion of the encapsulant comprises removing the encapsulant to a level of the plane.

5. The method of claim 3, wherein removing a portion of the encapsulant comprises forming an annular region in the encapsulant around the at least one of the solder balls, the region having a flat bottom parallel to or lying in the plane and a sidewall spaced from the at least one of the solder balls and extending at an obtuse angle from the flat bottom.

6. The method of claim 1, further comprising:
    cleaning the interconnect after removing a portion of the encapsulant.

7. The method of claim 1,
    wherein the removing is performed by laser ablation,
    wherein the interconnects are solder balls and a diameter of at least one of the solder balls lies in a plane parallel to the bottom side, and
    wherein removing a portion of the encapsulant comprises forming an annular region in the encapsulant around the at least one of the solder balls, the annular region having a flat bottom parallel to or lying in the plane and a sidewall spaced from the at least one of the solder balls and extending at an obtuse angle from the flat bottom.

8. A method of forming a semiconductor device comprising:
    providing a substrate having a planar first side lying in a first plane;
    forming a plurality of electrically conductive interconnects on the planar first side;
    at least partially encapsulating, with an encapsulant, the plurality of electrically conductive interconnects without completely encapsulating the interconnects; and
    forming an annular region in the encapsulant around the interconnects having a flat bottom parallel to or lying in the first plane.

9. The method of claim 8, wherein the annular region includes sidewalls extending away from the flat bottom at an obtuse angle.

10. The method of claim 8, including mounting a semiconductor element on a second side of the substrate opposite the planar first side.

11. The method of claim 8, wherein the interconnects comprise solder balls having a diameter lying in a second plane parallel to the first plane and wherein the flat bottom is parallel to or lies in the second plane.

12. The method of claim 8, wherein the forming comprises laser ablation and wherein the annular region includes a sidewall extending away from the flat bottom at an obtuse angle.

13. The method of claim 8,
including mounting a semiconductor element on a second side of the substrate opposite the planar first side; and
pressing the solder balls against a surface,
wherein the interconnects comprise solder balls having a diameter lying in a second plane parallel to the first plane and wherein the flat bottom is parallel to or lies in the second plane,
wherein the forming comprises removing by laser ablation, and
wherein the annular region includes sidewalls extending away from the flat bottom at an obtuse angle.

14. A method of forming a semiconductor device comprising:
providing a substrate having a top side having a mounting location for at least one semiconductor element and a bottom side having a plurality of locations electrically connected to locations on said top side;
steps for forming a plurality of electrically conductive interconnects at the plurality of locations on the bottom side;
steps for at least partially encapsulating, with an encapsulant, the plurality of electrically conductive interconnects without completely encapsulating the electrically conductive interconnects; and
steps for removing a portion of the encapsulant adjacent to each of the electrically conductive interconnects to expose previously encapsulated portions of the electrically conductive interconnects while leaving portions of the electrically conductive interconnects adjacent to the bottom side encapsulated by the encapsulant, wherein the steps for removing a portion of the encapsulant comprise forming an annular region in the encapsulant around the at least one of the solder balls, the annular region having a flat bottom parallel to the bottom side.

15. The method of claim 14, wherein the steps for removing include laser ablation.

16. The method of claim 14, further comprising steps for cleaning the interconnect after removing the portion of the encapsulant.

17. A method of forming a semiconductor device comprising:
providing a substrate having a planar first side lying in a first plane;
steps for forming a plurality of electrically conductive interconnects on the planar first side;
steps for at least partially encapsulating, with an encapsulant, the plurality of electrically conductive interconnects without completely encapsulating the electrically conductive interconnects; and
steps for forming an annular region in the encapsulant around the electrically conductive interconnects having a flat bottom parallel to or lying in the first plane.

18. The method of claim 17, including steps for mounting a semiconductor element on a second side of the substrate opposite the planar first side.

19. The method of claim 17, wherein the steps for forming comprise laser ablation and wherein the annular region includes a sidewall extending away from the flat bottom at an obtuse angle.

* * * * *